(12) United States Patent
Mizutani et al.

(10) Patent No.: US 9,837,308 B2
(45) Date of Patent: Dec. 5, 2017

(54) PLATING METHOD, PLATING SYSTEM AND STORAGE MEDIUM

(71) Applicant: Tokyo Electron Limited, Tokyo (JP)

(72) Inventors: Nobutaka Mizutani, Nirasaki (JP); Takashi Tanaka, Nirasaki (JP); Yuichiro Inatomi, Nirasaki (JP); Yusuke Saito, Nirasaki (JP); Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 252 days.

(21) Appl. No.: 14/384,861

(22) PCT Filed: Feb. 22, 2013

(86) PCT No.: PCT/JP2013/054505
§ 371 (c)(1),
(2) Date: Sep. 12, 2014

(87) PCT Pub. No.: WO2013/145979
PCT Pub. Date: Oct. 3, 2013

(65) Prior Publication Data
US 2015/0079785 A1  Mar. 19, 2015

(30) Foreign Application Priority Data
Mar. 27, 2012  (JP) .................................. 2012-072328

(51) Int. Cl.
*H01L 21/768* (2006.01)
*H01L 21/288* (2006.01)
(Continued)

(52) U.S. Cl.
CPC ...... *H01L 21/76867* (2013.01); *C23C 14/024* (2013.01); *C23C 14/046* (2013.01);
(Continued)

(58) Field of Classification Search
CPC ......... H01L 21/76867; H01L 21/76841; H01L 21/76874; H01L 21/76873;
(Continued)

(56) References Cited

U.S. PATENT DOCUMENTS 5,527,561 A * 6/1996 Dobson ............... H01L 21/3105
204/192.17
5,689,140 A * 11/1997 Shoda ............... H01L 21/76879
257/751
(Continued)

FOREIGN PATENT DOCUMENTS

JP    63-318750 A   12/1988
JP    11-256318 A    9/1999
(Continued)

OTHER PUBLICATIONS

International Search Report issued in Application No. PCT/JP2013/054505 dated Apr. 2, 2013.

*Primary Examiner* — Michael Trinh
(74) *Attorney, Agent, or Firm* — Pearne & Gordon LLP (57) ABSTRACT

A plating method can improve adhesivity with a substrate. The plating method of performing a plating process on the substrate includes forming a vacuum-deposited layer 2A on the substrate 2 by performing a vacuum deposition process on the substrate 2; forming an adhesion layer 21 and a catalyst adsorption layer 22 on the vacuum-deposited layer 2A of the substrate 2; and forming a plating layer stacked body 23 having a first plating layer 23a and a second plating layer 23b which function as a barrier film on the catalyst adsorption layer 22 of the substrate 2. By forming the vacuum-deposited layer 2A, a surface of the substrate 2 can be smoothened, so that the vacuum-deposited layer 2A serving as an underlying layer can improve the adhesivity.

6 Claims, 6 Drawing Sheets

(51) Int. Cl.
| | |
|---|---|
| *C23C 18/18* | (2006.01) |
| *C23C 18/16* | (2006.01) |
| *C23C 18/38* | (2006.01) |
| *C23C 14/02* | (2006.01) |
| *C23C 16/02* | (2006.01) |
| *C23C 28/00* | (2006.01) |
| *C23C 14/24* | (2006.01) |
| *C23C 14/04* | (2006.01) |
| *C23C 16/04* | (2006.01) |

(52) U.S. Cl.
CPC .......... *C23C 14/24* (2013.01); *C23C 16/0272* (2013.01); *C23C 16/045* (2013.01); *C23C 18/165* (2013.01); *C23C 18/1619* (2013.01); *C23C 18/1632* (2013.01); *C23C 18/1651* (2013.01); *C23C 18/1653* (2013.01); *C23C 18/1692* (2013.01); *C23C 18/1694* (2013.01); *C23C 18/1844* (2013.01); *C23C 18/1893* (2013.01); *C23C 18/38* (2013.01); *C23C 28/322* (2013.01); *C23C 28/34* (2013.01); *H01L 21/288* (2013.01); *H01L 21/76841* (2013.01); *H01L 21/76843* (2013.01); *H01L 21/76873* (2013.01); *H01L 21/76874* (2013.01); *H01L 21/76898* (2013.01)

(58) Field of Classification Search
CPC ......... H01L 21/76898; H01L 21/76843; H01L 21/288; C23C 16/045; C23C 16/0272; C23C 14/046; C23C 16/24; C23C 16/024; C23C 18/1619; C23C 18/1632; C23C 18/322; C23C 18/1653; C23C 18/1692; C23C 18/165; C23C 18/1893; C23C 18/1651; C23C 18/1694; C23C 18/1844; C23C 18/38

See application file for complete search history.

(56) References Cited

U.S. PATENT DOCUMENTS

| | | | | |
|---|---|---|---|---|
| 6,016,012 | A * | 1/2000 | Chatila | ............ H01L 21/76843 257/753 |
| 7,807,571 | B2 * | 10/2010 | Choi | ................. H01L 21/76843 257/768 |
| 2003/0068887 | A1 * | 4/2003 | Shingubara | ........... H01L 21/288 438/687 |
| 2003/0140988 | A1 * | 7/2003 | Gandikota | .......... C23C 18/1651 148/527 |
| 2005/0009334 | A1 * | 1/2005 | Shingubara | ......... H01L 21/7684 438/678 |

FOREIGN PATENT DOCUMENTS

| | | |
|---|---|---|
| JP | 2003-129285 A | 5/2003 |
| JP | 2003-178999 A | 6/2003 |
| JP | 2006-016684 A | 1/2006 |
| JP | 2009-108386 A | 5/2009 |
| JP | 2010-185113 A | 8/2010 |

* cited by examiner

PLATING METHOD, PLATING SYSTEM AND STORAGE MEDIUM

CROSS-REFERENCE TO RELATED APPLICATION

This Application is a U.S. national phase application under 35 U.S.C. §371 of PCT Application No. PCT/JP2013/054505 filed on Feb. 22, 2013, which claims the benefit of Japanese Patent Application No. 2012-072328 filed on Mar. 27, 2012, the entire disclosures of which are incorporated herein by reference.

TECHNICAL FIELD

The embodiments described herein pertain generally to a plating method and a plating system of performing a plating process on a substrate, and a storage medium.

BACKGROUND ART

Recently, semiconductor devices such as a LSI or the like have been required to have higher density in order to meet requirements for reducing the mounting space or for improving the processing rate. As an example of a technology that achieves the high density, there has been known a multilayer wiring technology of manufacturing a multilayer substrate, such as a three-dimensional LSI or the like, by stacking multiple wiring substrates.

According to the multilayer wiring technology, a through-via-hole, which penetrates the wiring substrates and in which a conductive material such as copper (Cu) is buried, is typically formed in the wiring substrate in order to obtain electrical connection between the wiring substrates. As an example of a technology for forming the through-via-hole in which a conductive material is buried, there has been known an electroless plating method.

As a specific method of producing a wiring substrate, there is known a method in which a substrate having a recess is prepared, a barrier film is formed as a Cu diffusion barrier film within the recess of the substrate, and a seed film is formed on the barrier film by electroless Cu plating. Thereafter, Cu is buried in the recess by electrolytic Cu plating, and the substrate in which the Cu is buried is then thinned by a polishing method such as chemical mechanical polishing. Through this process, a wiring substrate having a through-via-hole in which the Cu is buried is manufactured.

To form the barrier film of the aforementioned wiring substrate, by adsorbing a catalyst onto the substrate in advance, a catalyst adsorption layer is formed, and by performing a plating process on the catalyst adsorption layer, a barrier film formed of Co—W—B layers is obtained. The barrier film is then baked, so that moisture within the barrier film is removed and the bond between metals is strengthened.

REFERENCES

Patent Document 1: Japanese Patent Laid-open Publication No. 2010-185113

DISCLOSURE OF THE INVENTION

Problems to be Solved by the Invention

As stated above, the barrier film as the Cu diffusion barrier film is formed through the plating process, and by being baked thereafter, moisture within the barrier film is removed and the bond between the metals is enhanced.

As stated above, the substrate has the recess, and the barrier film as the Cu diffusion barrier film is formed on an inner surface of the recess of the substrate and on an outer surface of the substrate at an outside of the recess. The barrier film formed on the outer surface of the substrate may be peeled off by an external force applied to the substrate when the substrate is processed, so that a problem in the produced multilayer substrate is caused.

In view of the foregoing problems, example embodiments provide a plating method and a plating system capable of suppressing the plating layer formed on the outer surface of the substrate at the outside of the recess from being peeled off from the substrate when forming the plating layer such as a barrier film by performing a plating process on the substrate, and a storage medium.

Means for Solving the Problems

In one example embodiment, a plating method of performing a plating process on a substrate includes a substrate preparing process of preparing the substrate; a vacuum-deposited layer forming process of forming a vacuum-deposited layer on the substrate by performing a vacuum deposition process on the substrate; and a plating layer forming process of forming a plating layer having a preset function on the vacuum-deposited layer by performing the plating process on the substrate with a plating liquid.

In another example embodiment, a plating system of performing a plating process on a substrate includes a vacuum-deposited layer forming unit configured to form a vacuum-deposited layer on a surface of a substrate by performing a vacuum deposition process on the substrate; a plating layer forming unit configured to form a plating layer having a preset function on the vacuum-deposited layer by performing the plating process on the substrate with a plating liquid; a substrate transfer unit configured to transfer the substrate between the vacuum-deposited layer forming unit and the plating layer forming unit; and a controller configured to control the vacuum-deposited layer forming unit, the plating layer forming unit and the substrate transfer unit.

In yet another example embodiment, a computer-readable storage medium has stored thereon computer-executable instructions that, in response to execution, cause a plating system to perform a plating method. Further, the plating method includes a substrate preparing process of preparing a substrate; a vacuum-deposited layer forming process of forming a vacuum-deposited layer on the substrate by performing a vacuum deposition process on the substrate; and a plating layer forming process of forming a plating layer having a preset function on the vacuum-deposited layer by performing the plating process on the substrate with a plating liquid.

Effect of the Invention

In accordance with the example embodiments, the vacuum-deposited layer is formed on the substrate by performing the vacuum deposition process on the substrate, and the plating layer is formed on the vacuum-deposited layer by performing the plating process on the substrate. That is, the vacuum-deposited layer is formed on the substrate as the underlying layer, and the surface of the substrate is smoothened by the vacuum-deposited layer as the underlying layer. Accordingly, by forming the vacuum-deposited layer serving as the underlying layer, it is possible to form the plating layer on the substrate with high adhesivity. Therefore, the plating layer can be suppressed from being damaged or peeled off by an external force applied to the substrate when the substrate is processed.

DETAILED DESCRIPTION

Plating System

Referring to FIG. 1 to FIG. 8, an example embodiment will be described.

Figure 1:
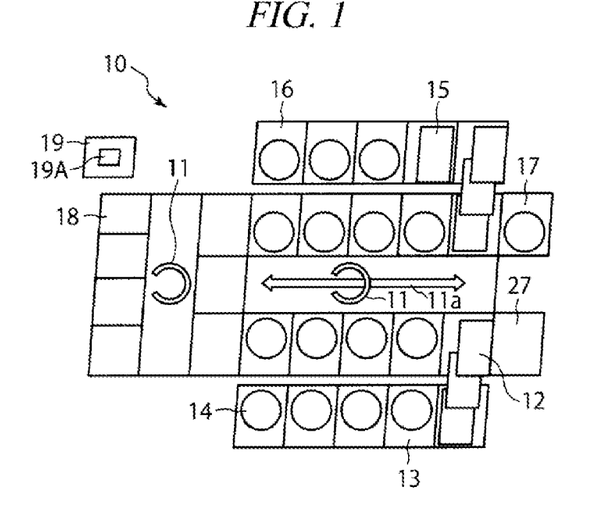
FIG. 1 is a block diagram illustrating a plating system in accordance with an example embodiment.

First, a plating system in accordance with the example embodiment will be elaborated with reference to FIG. 1.

As depicted in FIG. 1, the plating system 10 is configured to perform a plating process on a substrate (silicon substrate) 2, such as a semiconductor wafer, having a recess 2a (See FIG. 3A to FIG. 3G).

The plating system 10 includes a cassette station 18 configured to mount thereon a cassette (not shown) which accommodates the substrate 2; a substrate transfer arm 11 configured to take out the substrate 2 from the cassette on the cassette station 18 and transfer the substrate 2; and a moving path 11a along which the substrate transfer arm 11 is moved.

Arranged at one side of the moving path 11a are a vacuum-deposited layer forming unit 27 configured to form a vacuum-deposited layer 2A on a surface of the substrate 2 by performing a vacuum deposition process on the substrate 2; an adhesion layer forming unit 12 configured to form an adhesion layer 21 to be described later by adsorbing a coupling agent such as a silane coupling agent onto the vacuum-deposited layer 2a of the substrate 2; a catalyst adsorption layer forming unit 13 configured to form a catalyst adsorption layer 22 to be described later by adsorbing a catalyst onto the adhesion layer 21 of the substrate; and a plating layer forming unit 14 configured to form plating layers 23a and 23b serving as a Cu diffusion barrier film (barrier film) to be described later on the catalyst adsorption layer 22 of the substrate 2.

Further, arranged at the other side of the moving path 11a are a plating layer baking unit 15 configured to bake the plating layers 23a and 23b formed on the substrate 2; and an electroless Cu plating layer forming unit 16 configured to form an electroless copper (Cu) plating layer 24, serving as a seed film to be described later, on the plating layers 23a and 23b formed on the substrate 2.

Further, an electrolytic Cu plating layer forming unit 17 configured to fill the recess 2a of the substrate 2 with an electrolytic Cu plating layer 25 while using the electroless Cu plating layer 24 as a seed film is provided adjacent to the plating layer baking unit 15.

After the first plating layer 23a is formed in the plating layer forming unit 14, the first plating layer 23a is baked in the plating layer baking unit 15. Then, in the plating layer forming unit 14, the second plating layer 23b is formed on top of the baked first plating layer 23a, and the second plating layer 23b is then baked in the plating layer baking unit 15.

Through these processes, the plating layer stacked body 23 in which the first plating layer 23a and the second plating layer 23b are stacked is formed on the catalyst adsorption layer 22 of the substrate 2.

Each of the first plating layer 23a and the second plating layer 23b of the plating layer stacked body 23 having the above-described structure serves as a Cu diffusion barrier film (barrier film).

Further, the respective constituent components of the above-described plating system, for example, the cassette station 18, the substrate transfer arm 11, the vacuum-deposited layer forming unit 27, the adhesion layer forming unit 12, the catalyst adsorption layer forming unit 13, the plating layer forming unit 14, the plating layer baking unit 15, the electroless Cu plating layer forming unit 16 and the electrolytic Cu plating layer forming unit 17 are controlled by a controller 19 according to various types of programs recorded in a storage medium 19A provided in the controller 19, so that various processes are performed on the substrate 2. Here, the storage medium 19A stores thereon various kinds of setup data or various kinds of programs such as a plating method to be described later. The storage medium 19A may be implemented by a computer-readable memory such as a ROM or a RAM, or a disk-type storage medium such as a hard disk, a CD-ROM, a DVD-ROM or a flexible disk, as commonly known in the art.

Below, the vacuum-deposited layer forming unit 27, the plating layer forming unit 14 and the plating layer baking unit 15 configured to form the first plating layer 23a and the second plating layer 23b, which serve as the Cu diffusion barrier film (barrier film), and the electroless Cu plating layer forming unit 16 will be further elaborated.

(Vacuum-Deposited Layer Forming Unit 27)

Figure 8:
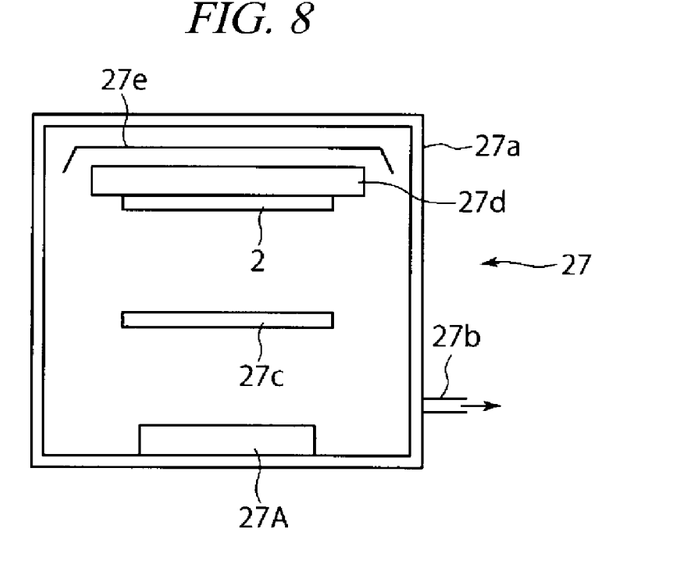
FIG. 8 is a side cross sectional view illustrating a vacuum deposition layer forming unit.
Figure 9:
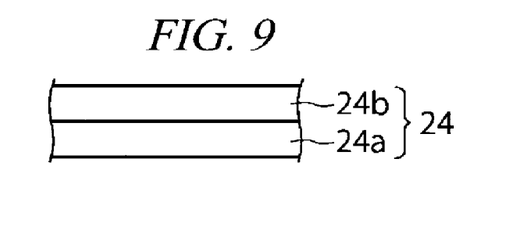
FIG. 9 is a cross sectional view showing a plating layer stacked body as a seed film in accordance with a modification example of the example embodiment.

Among these, the vacuum-deposited layer forming unit 27 includes, as illustrated in FIG. 8, an airtightly sealed casing 27a; a substrate holder 27d provided within the airtightly sealed casing 27a and configured to hold the substrate 2; and an evaporation source 27A in which a metal to be deposited on the surface of the substrate 2 held by the substrate holder 27d is stored. Further, the airtightly sealed casing 27a is provided with a vacuum exhaust opening 27b through which an inside of the airtightly sealed casing 27a is evacuated. A non-illustrated vacuum pump is connected to the vacuum exhaust opening 27b, and the airtightly sealed casing 27a serves as a decompression chamber.

Within the airtightly sealed casing 27a, a shutter 27c is provided between the substrate 2 held by the substrate holder 27*d* and the evaporation source 27A. A heater 27*e* is provided above the substrate holder 27*d* to cover the substrate holder 27*d*.

In the vacuum-deposited layer forming unit 27 shown in FIG. 8, a PVD process is performed on the substrate 2, and a vacuum-deposited layer 2A is formed on the substrate 2 through the PVD process.

Here, the vacuum-deposited layer 2A formed on the substrate 2 by the PVD process may be formed of a vacuum-deposited layer of Pd or Ru, a vacuum-deposited layer of PdN or RuN, a vacuum deposition layer of Ti or Ta, a vacuum-deposited layer of TiN or TaN, or a vacuum deposition layer of Ru.

Besides, a stacked body of Pd and PdN, a stacked body of Ru and RuN, a stacked body of Ti and TiN or a stacked body of Ta and TaN may also be used as the vacuum-deposited layer 2A.

Further, a CVD processing apparatus configured to form the vacuum-deposited layer 2A on the substrate 2 through a CVD process instead of the PVD process may also be employed as the vacuum-deposited layer forming unit 27.

As the vacuum-deposited layer 2A formed on the substrate 2 by using the CVD processing apparatus, a layer formed by depositing Ru may be used.

Further, the vacuum-deposited layer 2A may not be limited to the aforementioned layers having metals, and layers of any metal making an electroless reaction and having adhesivity with respective layers on the vacuum-deposited layer 2A may be utilized.

As stated above, by forming the vacuum-deposited layer 2A on the substrate 2 in the vacuum-deposited layer forming unit 27, the vacuum-deposited layer 2A serves as an underlying layer, and the surface of the substrate 2 can be smoothened. Accordingly, adhesivity between the substrate 2 and the respective layers on the vacuum-deposited layer 2A to be described later, e.g., the adhesion layer 21 can be improved.

(Plating Layer Forming Unit 14 and Electroless Cu Plating Layer Forming Unit 16)

Now, the plating layer forming unit 14 and the electroless Cu plating layer forming unit 16 will be elaborated.

Figure 5:
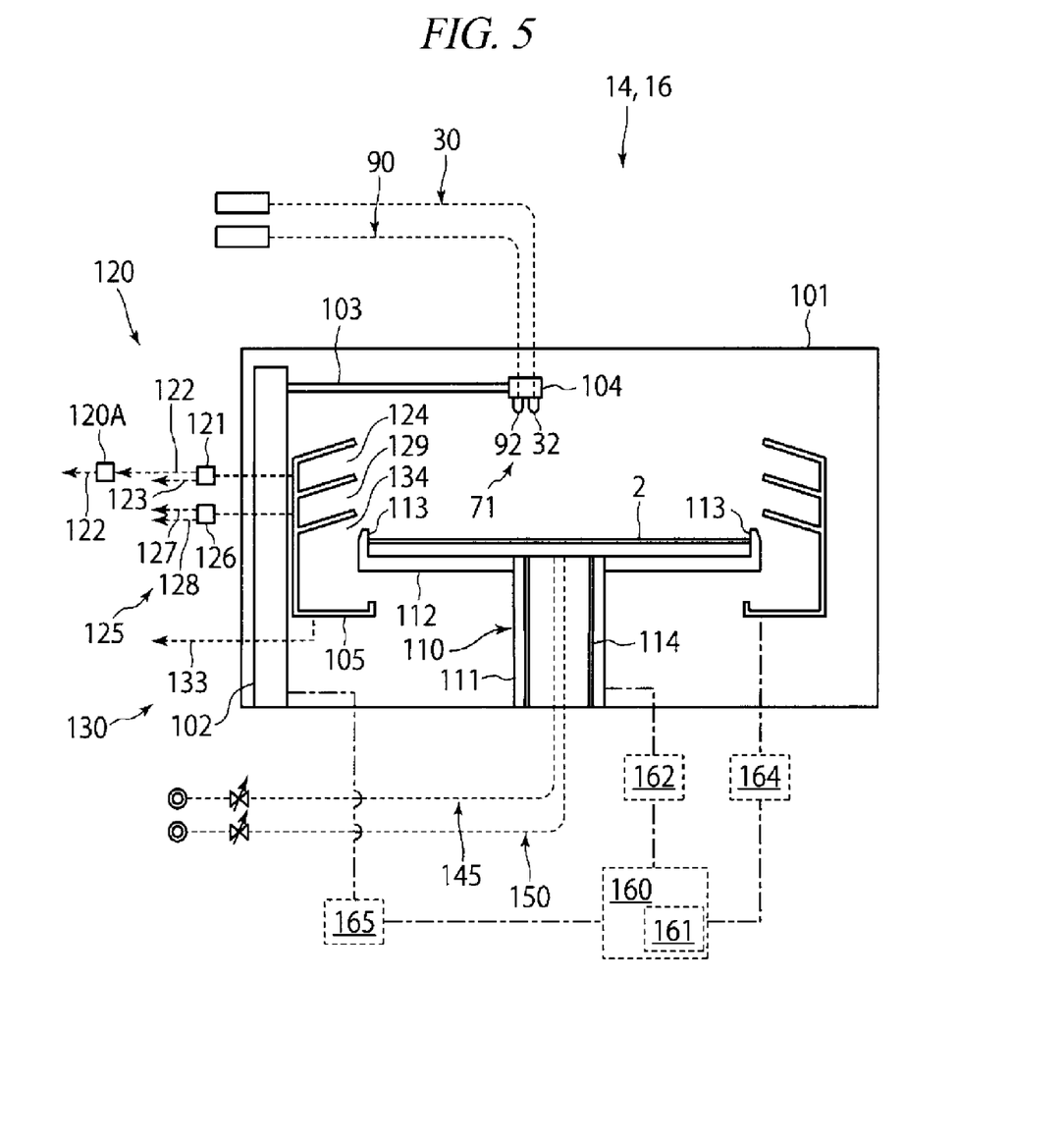
FIG. 5 is a side cross sectional view illustrating a plating layer forming unit.
Figure 6:
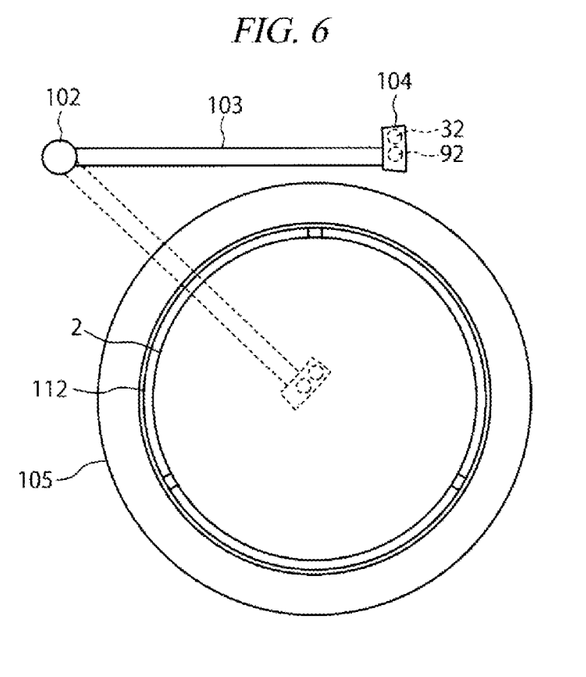
FIG. 6 is a plane view illustrating the plating layer forming unit.

Among these, each of the plating layer forming unit 14 and the electroless Cu plating layer forming unit 16 may be implemented by a plating apparatus 14 and 16 as illustrated in FIG. 5 and FIG. 6.

These plating apparatuses 14 and 16 are as depicted in FIG. 5 and FIG. 6.

That is, each of the plating apparatuses 14 and 16 includes, as shown in FIG. 5 and FIG. 6, a substrate holding/rotating device (substrate accommodating unit) 110 configured to hold and rotate the substrate 2 within a casing 101; liquid supplying devices 30 and 90 configured to supply a plating liquid, a cleaning liquid or the like onto a surface of the substrate 2; a cup 105 configured to collect the plating liquid, the cleaning liquid or the like dispersed from the substrate 2; draining openings 124, 129 and 134 configured to drain the plating liquid or the cleaning liquid collected by the cup 105; liquid draining devices 120, 125 and 130 configured to drain the liquids collected in the draining openings; and a controller 160 configured to control the substrate holding/rotating device 110, the liquid supplying devices 30 and 90, the cup 105 and the liquid draining devices 120, 125 and 130.

(Substrate Holding/Rotating Device)

The substrate holding/rotating device 110 includes, as illustrated in FIG. 5 and FIG. 6, a hollow cylindrical rotation shaft 111 vertically extended within the casing 101; a turntable 112 provided on an upper end portion of the rotation shaft 111; a wafer chuck 113 disposed on a peripheral portion of a top surface of the turntable 112 to support the substrate 2; and a rotating device 162 configured to rotate the rotation shaft 111. The rotating device 162 is controlled by the controller 160, and the rotation shaft 111 is rotated by the rotating device 162. As a result, the substrate 2 supported on the wafer chuck 113 is rotated.

(Liquid Supplying Device)

Now, the liquid supplying devices 30 and 90 configured to supply a plating liquid, a cleaning liquid, or the like onto the surface of the substrate 2 will be explained with reference to FIG. 5 and FIG. 6. The liquid supplying device 30 is a plating liquid supplying device configured to supply a plating liquid for performing a plating process on the surface of the substrate 2. The liquid supplying device 90 is a cleaning liquid supplying device configured to supply a cleaning liquid onto the surface of the substrate 2.

As depicted in FIG. 5 and FIG. 6, a discharge nozzle 32 is provided at a nozzle head 104. The nozzle head 104 is provided at a leading end portion of an arm 103. The arm 103 is provided at a supporting shaft 102 rotated by a rotating device 165 to be moved in a vertical direction. A plating liquid supplying line of the plating liquid supplying device 30 is embedded within the arm 103. With this configuration, it is possible to discharge the plating liquid onto a target position on the surface of the substrate 2 through the discharge nozzle 32 from a required supply height.

(Cleaning Liquid Supplying Device 90)

The cleaning liquid supplying device 90 is configured to perform a cleaning process on the substrate 2 as will be described later. As illustrated in FIG. 5, the cleaning liquid supplying device 90 includes a nozzle 92 provided at the nozzle head 104. In this configuration, either a cleaning liquid or a rinse liquid is selectively discharged onto the surface of the substrate 2 from the nozzle 92.

(Liquid Draining Device)

Now, the liquid draining devices 120, 125 and 130 configured to drain out the plating liquid or the cleaning liquid dispersed from the substrate 2 will be elaborated with reference to FIG. 5. As shown in FIG. 5, the cup 105, which can be moved up and down by an elevating device 164 and has the draining openings 124, 129 and 134, is disposed within the casing 101. The liquid draining devices 120, 125 and 130 are configured to drain out the liquids collected in the draining openings 124, 129 and 134, respectively.

As depicted in FIG. 5, the plating liquid draining devices 120 and 125 include collecting flow paths 122 and 127 and waste flow paths 123 and 128, which are switched by flow path switching devices 121 and 126, respectively. Here, the plating liquid is collected and reused through the collecting flow paths 122 and 127, while the plating liquid is drained out through the waste flow paths 123 and 128. Further, as shown in FIG. 5, the processing liquid draining device 130 is only equipped with a waste flow path 133.

Further, as depicted in FIG. 5 and FIG. 6, the collecting flow path 122 of the plating liquid draining device 120 configured to drain the plating liquid is connected to an outlet side of the substrate accommodating unit 110, and a cooling buffer 120A configured to cool the plating liquid is provided at a portion of the collecting flow path 122 in the vicinity of the outlet side of the substrate accommodating unit 110.

(Plating Layer Baking Unit 15)

Now, the plating layer baking unit 15 will be elaborated.

Figure 7:
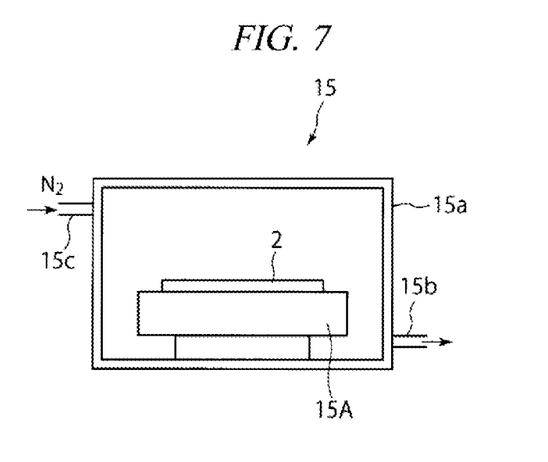
FIG. 7 is a side cross sectional view illustrating a plating layer baking unit.

The plating layer baking unit 15 includes, as illustrated in FIG. 7, an airtightly sealed casing 15a; and a hot plate 15A provided within the airtightly sealed casing 15a.

The airtightly sealed casing 15a of the plating layer baking unit 15 is provided with a transfer opening (not shown) through which the substrate 2 is transferred. An $N_2$ gas is supplied into the airtightly sealed casing 15a through an $N_2$ gas supply opening 15c.

Concurrently, the inside of the airtightly sealed casing 15a is evacuated through an exhaust opening 15b, and by supplying the $N_2$ gas into the airtightly sealed casing 15a, the inside of the airtightly sealed casing 15a can be maintained under an inert gas atmosphere.

An operation of the example embodiment having the above-described configuration will be explained with reference to FIG. 2 to FIG. 3G.

First, in a pre-process, a recess 2a is formed on a substrate (silicon substrate) 2 such as a semiconductor wafer or the like. The substrate 2 having thereon the recess 2a is then transferred into the plating system 10 in accordance with the example embodiment.

Here, as a method of forming the recess 2a on the substrate 2, a commonly known method in the art may be appropriately employed. Specifically, as a dry etching technique, for example, a general-purpose technique using a fluorine-based gas or a chlorine-based gas may be employed. Especially, in order to form a hole having a high aspect ratio (a hole depth/a hole diameter), a method using an ICP-RIE (Inductively Coupled Plasma Reactive Ion Etching) technique, which can perform a deep etching process with a high speed, may be more appropriately adopted. Especially, a Bosch process in which an etching process using sulfur hexafluoride ($SF_6$) and a protection process using a teflon-based gas such as $C_4F_8$ are repeatedly performed may be appropriately utilized.

Figure 2:
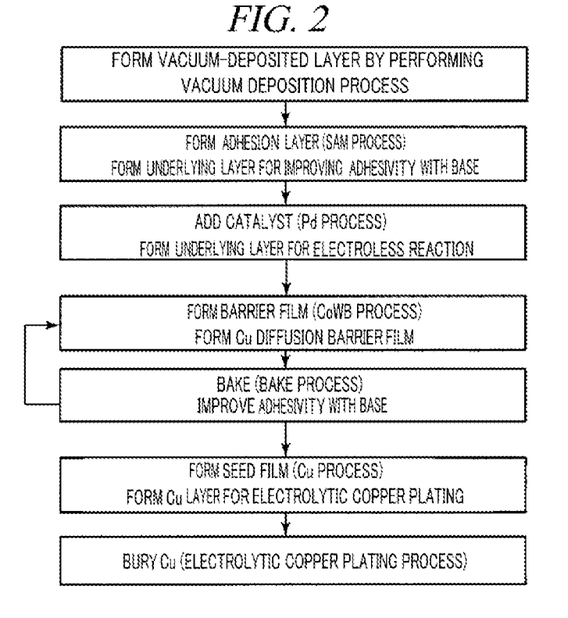
FIG. 2 is a flowchart for describing a plating method in accordance with the example embodiment.
Figure 3A:
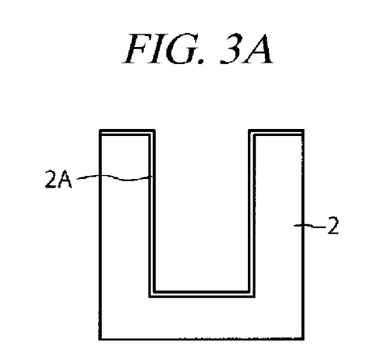
FIG. 3A to FIG. 3G are diagrams illustrating a substrate on which the plating method of the example embodiment is performed.

Thereafter, in the vacuum-deposited layer forming unit 27 of the plating system 10, a vacuum-deposited layer 2A is formed on the substrate 2 having the recess 2a (FIG. 2 and FIG. 3A).

As described above, in the vacuum-deposited layer forming unit 27, the PVD process is performed on the substrate 2, and the vacuum-deposited layer 2A is formed on the substrate 2 through the PVD process.

Here, however, it may be also possible to form the vacuum-deposited layer 2A on the substrate 2 by performing the CVD process on the substrate 2.

As stated above, by forming the vacuum-deposited layer 2A on the substrate 2, the vacuum-deposited layer 2A serves as an underlying layer, and the surface of the substrate 2 can be smoothened. Accordingly, the adhesivity between the substrate 2 and respective layers to be formed on the substrate 2 later can be improved.

Subsequently, the substrate 2 is sent to the adhesion layer forming unit 12 by the substrate transfer arm 11.

Figure 3B:
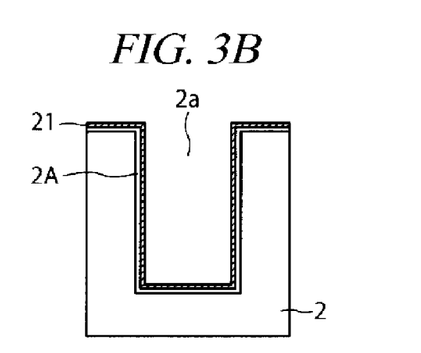

Then, within the adhesion layer forming unit 12, the adhesion layer 21 is formed on the vacuum-deposited layer 2A of the substrate 2 having the recess 2a (FIG. 2 and FIG. 3B).

Further, the adhesion layer forming unit 12 has a decompression chamber (not shown) equipped with a heating unit. Within the adhesion layer forming unit 12, a coupling agent such as a silane coupling agent is adsorbed onto the vacuum-deposited layer 2A of the substrate 2 having the recess 2a, so that the adhesion layer 21 is formed on the substrate 2 (SAM process). The adhesion layer 21 formed by adsorbing the silane coupling agent is configured to improve adhesivity between the substrate 2 and a catalyst adsorption layer 22 to be described later.

Figure 3C:
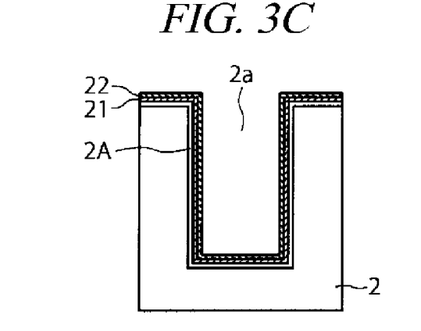

The substrate 2 on which the adhesion layer 21 is formed in the adhesion layer forming unit 12 is then transferred into the catalyst adsorption layer forming unit 13 by the substrate transfer arm 11. In the catalyst adsorption layer forming unit 13, Pd ions that may serve as a catalyst are adsorbed on the adhesion layer 21 of the substrate 2, so that the catalyst adsorption layer 22 is formed (FIG. 3C).

As the catalyst adsorbing process, a process of discharging an aqueous solution of palladium chloride through a nozzle and adsorbing Pd ions serving as the catalyst onto the surface of the substrate 2 may be employed. To elaborate, tin ions are adsorbed onto the surface of the substrate 2 by discharging a stannous chloride solution onto the substrate 2, and, then, by discharging the palladium chloride solution onto the surface 2 to replace the tin ions, the Pd ions are adsorbed onto the substrate 2. Then, by discharging sodium hydroxide onto the substrate 2, the tin ions remaining on the substrate 2 are removed.

After the catalyst adsorption layer 22 is formed on the substrate 2 in the catalyst adsorption layer forming unit 13 as stated above, the substrate 2 is then transferred into the plating layer forming unit 14 by the substrate transfer arm 11.

Figure 3D:
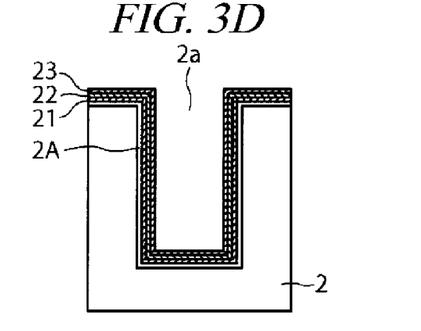
Figure 4:
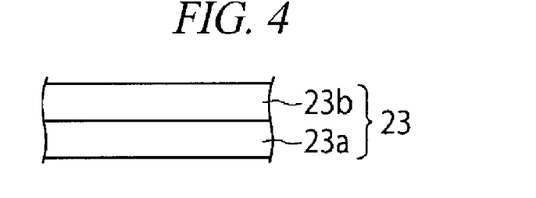
FIG. 4 is a cross sectional view illustrating a plating layer stacked body as a Cu diffusion barrier film.

Subsequently, in the plating layer forming unit 14, a first plating layer 23a serving as a Cu diffusion barrier film (barrier film) is formed on the catalyst adsorption layer 22 of the substrate 2 (23 of FIG. 3D and FIG. 4).

In this case, the plating layer forming unit 14 is implemented by the plating apparatus as illustrated in FIG. 5 and FIG. 6. The first plating layer 23a can be formed by performing an electroless plating process on the catalyst adsorption layer 22 of the substrate 2.

When forming the first plating layer in the plating layer forming unit 14, a plating liquid containing, for example, Co—W—B may be used, and a temperature of the plating liquid is maintained at 40° C. to 70° C.

By supplying the plating liquid containing the Co—W—B onto the substrate 2, the first plating layer 23a containing the Co—W—B is formed on the catalyst adsorption layer 22 of the substrate 2 through the electroless plating process.

Thereafter, the substrate 2 in which the first plating layer 23a is formed on the catalyst adsorption layer 22 is transferred from the plating layer forming unit 14 into the airtightly sealed casing 15a of the plating layer baking unit 15 by the substrate transfer arm 11. Within the airtightly sealed casing 15a of the plating layer baking unit 15, the substrate 2 is heated on the hot plate 15A under an inert gas atmosphere of $N_2$ gas. Accordingly, the first plating layer 23a of the substrate 2 is baked (baking process).

When baking the first plating layer 23a in the plating layer baking unit 15, a baking temperature may be set to be in the range from, e.g., 150° C. to 200° C., and a baking time is set to be in the range from, e.g., 10 minutes to 30 minutes.

By baking the first plating layer 23a on the substrate 2 as described above, moisture within the first plating layer 23a can be removed, and, at the same time, the bond between metals within the first plating layer 23a can be enhanced.

The substrate 2 heated in the plating layer baking unit 15 is delivered back to the plating layer forming unit 14 by the substrate transfer arm 11. Then, within the plating layer forming unit 14, an electroless plating process is performed on the substrate 2. Accordingly, the second plating layer 23b is formed on the first plating layer 23a through the autocatalytic plating.

When forming the second plating layer 23b on the first plating layer 23a, a plating liquid containing Co—W—B may be used, as in the case of forming the first plating layer 23a. A temperature of the plating liquid is maintained at 40° C. to 70° C., as in the case of forming the first plating layer 23a.

Alternatively, when forming the second plating layer 23b in the plating layer forming unit 14, unlike when forming the first plating layer 23a, a plating liquid containing Co—W—P may be used instead of the plating liquid containing the Co—W—B, and a temperature of the plating liquid may be in the range from, e.g., 40° C. to 80° C.

In any cases, when forming the second plating layer 23b, a plating liquid containing the same metals (Co—W) as the first plating layer 23a is used, and the second plating layer 23b formed as described above serves as a Cu diffusion barrier film (barrier film).

Subsequently, the substrate 2 on which the second plating layer 23b is formed in the plating layer forming unit 14 is delivered back to the plating layer baking unit 15 from the plating layer forming unit 14 by the substrate transfer arm 11. The substrate 2 is heated on the hot plate 15A within the airtightly sealed casing 15a of the plating layer baking unit 15, so that the second plating layer 23b is baked.

A baking temperature and a baking time for baking the second plating layer 23b are set to be the substantially same as the baking temperature and the baking time for baking the first plating layer 23a. However, the baking temperature and the baking time for the second plating layer 23b may be set to be different from the baking temperature and the baking time for the first plating layer 23a.

By baking the second plating layer 23b on the substrate 2, moisture within the second plating layer 23b can be removed, and, at the same time, the bond between metals within the second plating layer 23b can be enhanced.

Through the above-described processes, it is possible to obtain a plating layer stacked body 23 having the first plating layers 23a and the second plating layer 23b and serving as a Cu diffusion barrier film (barrier film).

In general, although the bonds between the metals in the first plating layer 23a and the second plating layer 23b can be enhanced by baking the plating layers 23a and 23b, if the thicknesses of the baked plating layers are large, a stress accompanied by deformation of the plating layers may be generated between an underlying layer and the plating layers.

In accordance with the present example embodiment, however, the plating layer stacked body 23 serving as the barrier film is formed of the first plating layer 23a obtained by the first plating layer forming process and the first plating layer baking process and the second plating layer 23b obtained by the second plating layer forming process and the second plating layer baking process. Thus, the thickness of the plating layer baked in the first baking process or in the second baking process can be made small, as compared to the entire thickness of the plating layer stacked body 23.

Accordingly, when baking the respective plating layers 23a and 23b, a stress generated between these layers and the underlying layer (for example, the catalyst adsorption layer 22) can be decreased, so that adhesivity between the plating layers 23a and 23b and the underlying layer can be increased.

Further, the plating layer stacked body 23 may not be limited to the structure including the first plating layer 23a and the second plating layer 23b. For example, the plating layer stacked body 23 may include a third plating layer and a fourth plating layer in addition to the first plating layer 23a and the second plating layer 23b.

The substrate 2 having the plating layer stacked body 23 serving as the barrier film is then sent to the electroless Cu plating layer forming unit 16 by the substrate transfer arm 11.

Figure 3E:
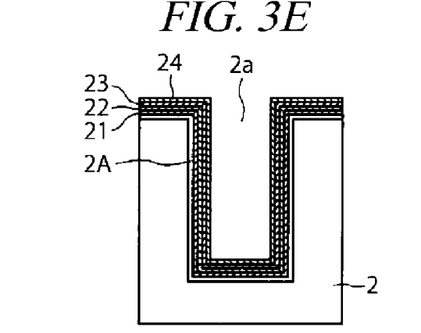

Subsequently, in the electroless Cu plating layer forming unit 16, an electroless Cu plating layer 24 serving as a seed film for forming an electrolytic Cu plating layer 25 is formed on the plating layer stacked body 23 of the substrate 2 (FIG. 3E).

Here, the electroless Cu plating layer forming unit 16 is implemented by the plating apparatus as illustrated in FIG. 5 and FIG. 6. By performing the electroless plating process on the plating layer stacked body 23 of the substrate 2, the electroless Cu plating layer 24 can be formed.

The electroless Cu plating layer 24 formed in the electroless Cu plating layer forming unit 16 serves as the seed film for forming the electrolytic Cu plating layer 25. A plating liquid used in the electroless Cu plating layer forming unit 16 may contain a copper salt as a source of copper ions, such as copper sulfate, copper nitrate, copper chloride, copper bromide, copper oxide, copper hydroxide, copper pyrophosphate, or the like. The plating liquid may further contain a reducing agent and a complexing agent for the copper ions. Further, the plating liquid may further contain various kinds of additives for improving stability or speed of the plating reaction.

Figure 3F:
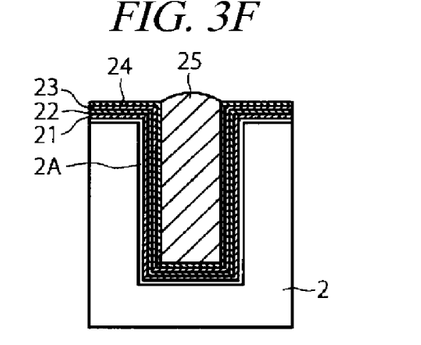

The substrate 2 on which the electroless Cu plating layer 24 is formed as described above is then sent to the electrolytic Cu plating layer forming unit 17 by the substrate transfer arm 11. Here, the substrate 2 on which the electroless Cu plating layer 24 is formed may be sent to the electrolytic Cu plating layer forming unit 17 after baked in the baking unit 15. Subsequently, an electrolytic Cu plating process is performed on the substrate 2 within the electrolytic Cu plating layer forming unit 17, so that the electrolytic Cu plating layer 25 is buried within the recess 2a of the substrate 2 while using the electroless Cu plating layer 24 as the seed film (FIG. 3F).

Figure 3G:
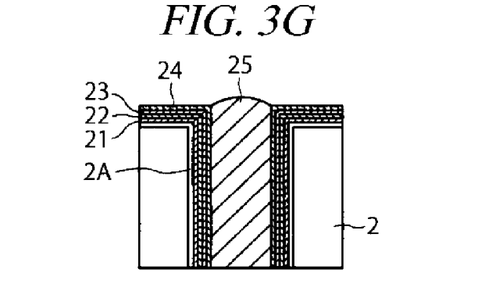

Thereafter, the substrate 2 is unloaded from the plating system 10, and a rear surface side of the substrate 2 (opposite side to the side where the recess 2a is formed) is polished chemically and mechanically (FIG. 3G).

In accordance with the example embodiment as described above, by forming the vacuum-deposited layer 2A on the substrate 2, the vacuum-deposited layer 2A serves as the underlying layer, and the surface of the substrate 2 can be smoothened. Accordingly, the adhesivity between the substrate 2 and the adhesion layer 21 formed on the vacuum-deposited layer 2A may be improved, so that the adhesivity between the substrate 2 and the plating layer stacked body 23 serving as the barrier film on the substrate 2 or the electroless Cu plating layer 24 serving as the seed film can be improved. As a consequence, the plating layer stacked body 23 serving as the barrier film or the electroless Cu plating layer 24 serving as the seed film can be suppressed from being peeled off from the substrate 2.

Figure 10A:
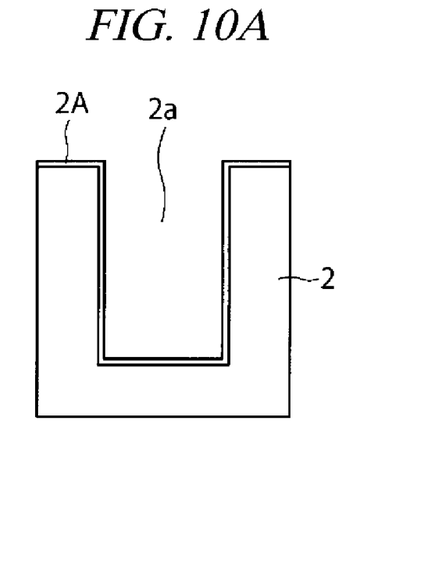
FIG. 10A and FIG. 10B are diagrams illustrating the vacuum-deposited layer formed on the substrate.

Here, the substrate 2 has the recess 2a, as stated above. In case of performing the vacuum deposition process in the vacuum-deposited layer forming unit 27, the vacuum-deposited layer 2A may be formed on the entire inner surface of the recess 2a, as illustrated in FIG. 10A. Meanwhile, the vacuum-deposited layer 2A may not be formed in the entire inner surface of the recess 2a but may only be formed on the outer surface of the substrate 2 at an outside of the recess 2a and on an upper portion of the inner surface of the recess 2a (see FIG. 10B). Further, the vacuum-deposited layer 2A may be formed only on the outer surface of the substrate 2 at the outside of the recess 2a (not shown).

Figure 10B:
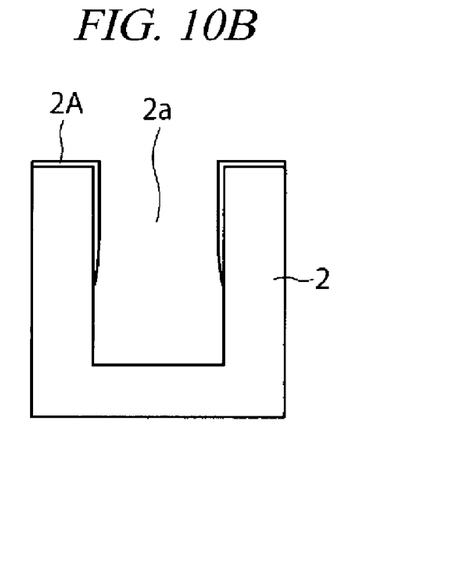

While the substrate 2 is being transferred, an external force may be applied to the substrate 2. Such an external force may be applied to the outer surface of the substrate 2. In FIG. 10B, the vacuum-deposited layer 2A as the underlying layer is formed at least on the outer surface of the substrate 2 at the outside of the recess 2a. Accordingly, even if the external force is applied to the outer surface of the substrate 2, the adhesivity between the vacuum-deposited layer 2A and the adhesion layer 21, the plating layer stacked body 23 and the electroless Cu plating layer 24 can be improved. As a result, the adhesion layer 21, the plating layer stacked body 23 and the electroless Cu plating layer 24 may be prevented from being delaminated or peeled off from the substrate 2.

In accordance with the present example embodiment, the plating layer stacked body 23 serving as the barrier film is formed of the first plating layer 23a obtained by the first plating layer forming process and the first plating layer baking process and the second plating layer 23b obtained by the second plating layer forming process and the second plating layer baking process. Accordingly, a stress between these plating layers and the underlying layer generated when baking the plating layers 23a and 23b can be reduced, so that adhesivity between the plating layers and the underlying layer can be enhanced.

Modification Examples

Now, modification examples of the example embodiment will be explained. In the above-described example embodiment, the plating layer stacked body 23 serving as the Cu diffusion barrier film (barrier film) is formed of the first plating layer 23a and the second plating layer 23b. However, the example embodiment may not be limited thereto, and the electroless Cu plating layer 24 serving as the seed film may be formed of a plating layer stacked body 23 having a first plating layer 24a and a second plating layer 24b (FIG. 8).

In such a case, the first plating layer 24a of the electroless Cu plating layer 24 is formed through a first plating layer forming process in the electroless Cu plating layer forming unit 16, and, then, baked through a first plating layer baking process in the plating layer baking unit 15. Further, the second plating layer 24b is formed through a second plating layer forming process in the electroless Cu plating layer forming unit 16 and, then, baked through a second plating layer baking process in the plating layer baking unit 15. Accordingly, the plating layer stacked body 24 having the first plating layer 24a and the second plating layer 24b and serving as the seed film for the electrolytic Cu plating layer 25 is obtained.

In the above-described example embodiment, the adhesion layer 21 and the catalyst adsorption layer 22 are formed on the vacuum-deposited layer 2A formed on the substrate 2, and the plating layer stacked body 23 serving as the barrier film is formed on the catalyst adsorption layer 22. However, the adhesion layer 21 and the catalyst adsorption layer 22 may not be formed on the vacuum-deposited layer 2A on the substrate 2, but the plating layer stacked body 23 serving as the barrier film may be formed on the vacuum-deposited layer 2A.

Further, in the above-described example embodiment, the plating layer stacked body 23 including the first plating layer 23a and the second plating layer 23b and serving as the barrier film is formed under the electroless Cu plating layer 24 which serves as the seed film. However, it may be also possible to form a plating layer 23 having a single layer and serving as a barrier film instead of the plating layer stacked body 23.

Furthermore, the plating layer stacked body 23 serving as the barrier film may not necessarily be formed under the electroless Cu plating layer 24 serving as the seed film.

Figure 11:
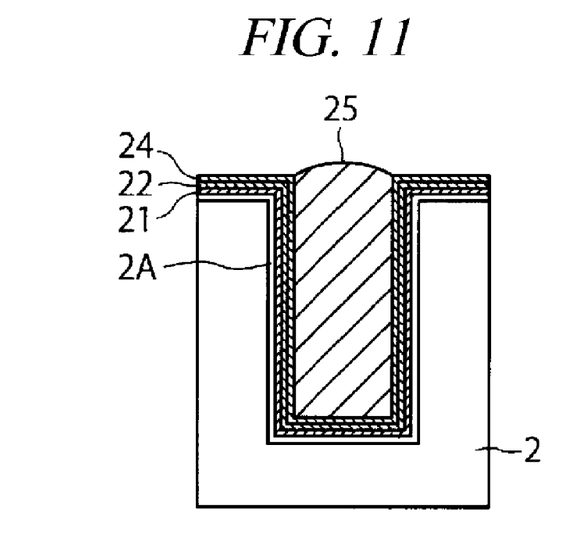
FIG. 11 is a diagram illustrating a substrate on which a plating method in accordance with a modification example of the example embodiment is performed.

That is, as depicted in FIG. 11, the vacuum-deposited layer 2A may be formed on the substrate 2 having the recess 2a, and the adhesion layer 21 and the catalyst adsorption layer 22 may be formed on the vacuum-deposited layer 2A. Then, without forming the barrier film on the catalyst adsorption layer 22, the electroless Cu plating layer 24 as seed film may be formed on the catalyst adsorption layer 22 through the catalytic plating reaction.

Here, FIG. 11 corresponds to FIG. 3F. As shown in FIG. 11, the electrolytic Cu plating layer 25 is buried in the recess 2a of the substrate 2 while using the electroless Cu plating layer 24 as the seed film.

EXPLANATION OF CODES

2: Substrate
2A: Vacuum-deposited layer
2a: Recess
10: Plating system
11: Substrate transfer arm
12: Adhesion layer forming unit
13: Catalyst adsorption layer forming unit
14: Plating layer forming unit
15: Plating layer baking unit
15A: Hot plate
15a: Airtightly sealed casing
15b: Exhaust opening
15c: N₂ gas supply opening
16: Electroless Cu plating layer forming unit
17: Electrolytic Cu plating layer forming unit
18: Cassette station
19: Controller
19A: Storage medium
21: Adhesion layer
22: Catalyst adsorption layer
23: Plating layer stacked body
23a: First plating layer
23b: Second plating layer
24: Electroless Cu plating layer
25: Electrolytic Cu plating layer
27: Vacuum-deposited layer forming unit

We claim:

1. A plating method of performing a plating process on a substrate, the plating method comprising:
preparing the substrate on which a plating layer has not been formed having a recess;
forming a vacuum-deposited layer only on an outer surface of the substrate at an outside of the recess and an upper portion of an inner surface of the recess, or only on the outer surface of the substrate at the outside of the recess by performing a vacuum deposition process on the substrate;
forming an adhesion layer on the vacuum-deposited layer and on a surface of the substrate at an inside of the recess by adsorbing a coupling agent onto the vacuum-deposited layer and the surface of the substrate at the inside of the recess;
forming a catalyst adsorption layer on the adhesion layer by adsorbing a catalyst onto the adhesion layer; and forming a plating layer on the catalyst adsorption layer by an electroless plating method with a plating liquid, wherein the plating layer is formed only on the surface of the catalyst adsorption layer such that the inside of the recess is not filled up with the plating layer.

2. The plating method of claim 1,
wherein the plating layer functions as a Cu diffusion barrier film.

3. The plating method of claim 1,
wherein the plating layer functions as a seed film for an electrolytic Cu plating layer.

4. The plating method of claim 1,
wherein the vacuum-deposited layer is formed through a PVD process.

5. The plating method of claim 1,
wherein the vacuum-deposited layer is formed through a CVD process.

6. A non-transitory computer-readable storage medium having stored thereon computer-executable instructions that, in response to execution, cause a plating system to perform a plating method,
wherein the plating method comprises:

preparing a substrate on which a plating layer has not been formed having a recess;

forming a vacuum-deposited layer only on an outer surface of the substrate at an outside of the recess and an upper portion of an inner surface of the recess, or only on the outer surface of the substrate at the outside of the recess by performing a vacuum deposition process on the substrate;

forming an adhesion layer on the vacuum-deposited layer and on a surface of the substrate at an inside of the recess by adsorbing a coupling agent onto the vacuum-deposited layer and the surface of the substrate at the inside of the recess;

forming a catalyst adsorption layer on the adhesion layer by adsorbing a catalyst onto the adhesion layer; and forming a plating layer on the catalyst adsorption layer by an electroless plating method with a plating liquid, wherein the plating layer is formed only on the surface of the catalyst adsorption layer such that the inside of the recess is not filled up with the plating layer.

* * * * *